(12) United States Patent
Park et al.

(10) Patent No.: US 8,446,200 B2
(45) Date of Patent: May 21, 2013

(54) SYSTEMS AND METHODS FOR A CONTINUOUS, LINEAR, 360-DEGREE ANALOG PHASE SHIFTER

(75) Inventors: Yunseo Park, Norcross, GA (US); Wangmyong Woo, Cumming, GA (US); Jaejoon Kim, Seoul (KR); Chang-Ho Lee, Marietta, GA (US)

(73) Assignee: Samsung Electro-Mechanics, Gyunngi-Do (KR)

( * ) Notice: Subject to any disclaimer, the term of this patent is extended or adjusted under 35 U.S.C. 154(b) by 77 days.

(21) Appl. No.: 13/104,777

(22) Filed: May 10, 2011

(65) Prior Publication Data

US 2012/0286839 A1 Nov. 15, 2012

(51) Int. Cl.
*H03K 3/00* (2006.01)
*H03K 5/13* (2006.01)
*H03H 11/16* (2006.01)

(52) U.S. Cl.
USPC ........... 327/236; 327/108; 327/109; 327/110; 327/231; 455/180.4; 455/337

(58) Field of Classification Search ................... 327/108, 327/109, 110, 231, 236; 455/180.4, 337
See application file for complete search history.

(56) References Cited

U.S. PATENT DOCUMENTS

| | | | |
|---|---|---|---|
| 5,028,892 A | 7/1991 | Daughters | |
| 5,119,050 A * | 6/1992 | Upshur et al. | 333/164 |
| 6,111,477 A * | 8/2000 | Klymyshyn et al. | 333/139 |
| 6,453,157 B1 * | 9/2002 | Roberts | 455/337 |
| 7,333,790 B2 | 2/2008 | Afsahi et al. | |

* cited by examiner

*Primary Examiner* — John Poos (57) ABSTRACT

Embodiments of the invention may be directed to a continuous analog phase shifter for radio frequency (RF) signals, which can be integrated on a CMOS process or another compatible process where inherent process-dependent passive components such as inductors and capacitors may have low quality factors. Insertion loss degradation for a given amount of phase shift may be compensated by using an active compensation circuit/device that smartly controls negative resistance generated from the compensation circuit/device to cancel out finite resistance of a network, leading to very small insertion loss variation. According to an example aspect of the invention, improved phase linearity and increased phase shift for a given size may be obtained by incorporating the compensation circuit/device. Thus, example analog phase shifters in accordance with example embodiments of the invention may have one or more of low insertion loss variation, small size, and good phase linearity over more than a 360 degree phase shift.

18 Claims, 9 Drawing Sheets

SYSTEMS AND METHODS FOR A CONTINUOUS, LINEAR, 360-DEGREE ANALOG PHASE SHIFTER

FIELD OF THE INVENTION

Embodiments of the invention relate generally to an analog phase shifter, and more particularly, to systems and methods for continuous, linear, 360-degree analog phase shifters.

BACKGROUND OF THE INVENTION

Traditionally, phase shifters are used in radio frequency (RF) discrete systems, where various high quality components are combined to achieve the required performance. These components are generally made of various materials and substrates. In order for the performance of these components to meet the system requirements, the quality factor for those components is usually high. As technology develops, most of the RF discrete components have become integrated in an integrated circuit (IC) process where lossy substrates are unavoidable due to cost and compatibility. Therefore, an analog phase shifter implemented as an IC must deal with an effect of a low quality factor for components that comprise the phase shifter.

Many prior art techniques that generate continuous phase shift (see, e.g., U.S. Pat. No. 5,028,892 and U.S. Pat. No. 5,119,050) have relied on circuits comprising high quality factor components (transmission line, gallium arsenide (GaAs) components, silicon-on-insulator (SOI) components, etc.). Some prior art techniques described the generation of continuous phase shift in an IC process (U.S. Pat. No. 7,333,790); however, these techniques cannot deliver the performance in terms of low insertion loss and good phase linearity, which can be achieved by others that utilize high quality factor components made of various materials and substrates.

Accordingly, there is an opportunity for systems and methods for a continuous, linear, 360-degree analog phase shifter, which may achieve stringent performance requirements and likewise be integrated into a low-cost IC process such as a complementary metal oxide semiconductor (CMOS) process.

SUMMARY OF THE INVENTION

Some or all of the above needs and/or problems may be addressed by certain embodiments of the invention. Embodiments of the invention may be directed to a continuous analog phase shifter for radio frequency (RF) signals, which can be integrated on a CMOS process or another compatible process where inherent process-dependent passive components such as inductors and capacitors may have low quality factors. Insertion loss degradation for a given amount of phase shift may be compensated by using an active compensation circuit/device that smartly controls negative resistance generated from the compensation circuit/device to cancel out finite resistance of a network, leading to very small insertion loss variation. According to an example aspect of the invention, improved phase linearity and increased phase shift for a given size may be obtained by incorporating the compensation circuit/device. Thus, example analog phase shifters in accordance with example embodiments of the invention may have one or more of low insertion loss variation, small size, and good phase linearity over more than a 360 degree phase shift.

According to an embodiment of the invention, there is disclosed a system. The system may include a phase shifting network comprising at least an inductor and a varactor having a variable capacitance that is controlled by a control voltage, wherein the phase shifting network operates to receive an input signal and generate an output signal, the output signal including a phase shift provided by the phase shifting network; and a compensation circuit in communication with the phase shifting network, wherein the compensation circuit is responsive at least in part to the control voltage to adjust a transconductance of the compensation circuit, wherein the compensation circuit delivers a negative resistance to the phase shifting network to reduce insertion loss associated with operation of the phase shifting network, the negative resistance based upon the transconductance that is adjusted responsive to the control voltage.

According to another embodiment, there is a method. The method may include providing a phase shifting network comprising at least an inductor and a varactor having a variable capacitance that is controlled by a control voltage; generating, by the phase shifting network, an output signal based upon a received input signal, the output signal including a phase shift provided by the phase shifting network; providing a compensation circuit in communication with the phase shifting network, wherein the compensation circuit is responsive at least in part to the control voltage to adjust a transconductance of the compensation circuit; and delivering, by the compensation circuit, a negative resistance to the phase shifting network to reduce insertion loss associated with operation of the phase shifting network, the negative resistance based upon the transconductance that is adjusted responsive to the control voltage.

BRIEF DESCRIPTION OF THE DRAWING

Having thus described the invention in general terms, reference will now be made to the accompanying drawings, which are not necessarily drawn to scale, and wherein:

DETAILED DESCRIPTION OF THE INVENTION

Example embodiments of the invention now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Embodiments of the invention may be directed to a continuous analog phase shifter for radio frequency (RF) signals, which can be integrated on a CMOS process or another compatible process where inherent process-dependent passive components such as inductors and capacitors may have low quality factors. Insertion loss degradation for a given amount of phase shift may be compensated by using an active compensation circuit/device that smartly controls negative resistance generated from the compensation circuit/device to cancel out finite resistance of a network, thereby providing very small insertion loss variation. According to an example aspect of the invention, improved phase linearity and increased phase shift for a given size may be obtained by incorporating the compensation circuit/device. Thus, example analog phase shifters in accordance with example embodiments of the invention may have one or more of low insertion loss variation, small size, and good phase linearity over more than a 360 degree phase shift. Indeed, an example analog continuous phase shifter may be configured to provide more phase shift, without degrading insertion loss, than that which a traditional lumped transmission line model can provide.

Accordingly, an analog phase shifter in accordance with an example embodiment may be capable of controlling the insertion phase for high frequency over a 360 degree range in a continuous, monotonic fashion without a change in insertion loss. By controlling its insertion loss, an example phase shifter can achieve a minimum insertion loss variation. An example analog phase shifter may also provide good phase linearity in order to support applications that depend on the absolute accuracy of the phase shifter. Likewise, the size of the phase shifter may be small enough to be integrated onto an IC process.

In an example embodiment of the invention, the example analog phase shifter may be integrated onto a lossy substrate such as a CMOS process or another process. For example, only a single type of lossy substrate may be utilized for implementing the example phase shifter, thereby facilitating the manufacture of, and lowering the cost of manufacturing, the phase shifter.

In accordance with an example embodiment of the invention, a continuous phase shifter, which may be operative over a broad band of radio frequencies, may include a pi-model LC network and a transconductance component or transconductor that provides a negative resistance when combined with capacitors in the network. The transconductance component or transconductor may include two terminals—(1) an input terminal for receiving the RF signals from the source, and (2) an output terminal for supplying insertion loss compensated signals at a desired phase shift determined by the LC network.

An example pi-model LC network may include one or more variable capacitors and an inductor fabricated mainly in an Integrated Circuit (IC) process, which can utilize various different substrate material and metal layers by which quality factors of the components are determined. A quality factor of the inductor may vary between close to 0 and tenth of hundreds (e.g., 0.01-0.09, etc.), according to an example embodiment of the invention. The amount of phase shift and insertion loss may be determined by controlling the capacitance of the variable capacitors and/or transconductance of the transconductance component or transconductor, perhaps at the same time.

In accordance with an aspect of an example embodiment of this invention, a continuous phase shifter may be constructed in a plurality of phase shifting stages, where each phase shifting stage may provide a respective phase shift. These plurality of phase shifting stages may be cascaded to cumulatively provide an overall cumulative phase shift, according to an example embodiment of the invention. For example, four phase shifting stages, each having a phase shift range of 90 degrees, may be utilized to collectively provide an overall phase shift of 360 degrees. Many variations of the phase shifting stages, or the phase shift provided by each phase shifting stage, are available without departing from example embodiments of the invention.

Figure 1:
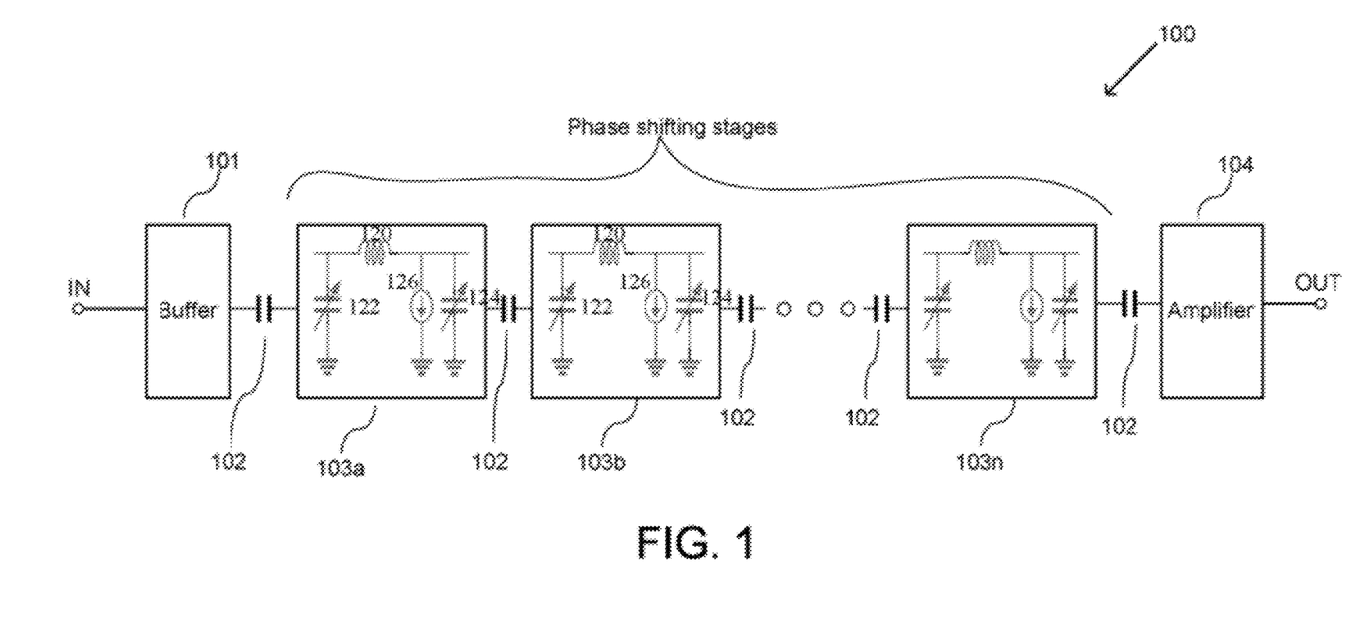
FIG. 1 is a block schematic diagram of an example analog phase shifter, according to an example embodiment of the invention.

FIG. 1 illustrates an example phase shifter 100 in accordance with an example embodiment of the invention. As shown in FIG. 1, the example phase shifter 100 may include a buffer stage 101. The buffer stage 101 may be positioned between an input (IN) port and a plurality of phase shifting stages 103$a$-$n$. As will be described in further detail herein, each phase shifting stage 103$a$-$n$ may utilize a respective transconductance-based loss compensation scheme. In addition, as described herein, one or more amplifiers 104 can be utilized as part of a phase shifting stage 103$a$-$n$, or prior to or following a phase shifting stage 103$a$-$n$, according to an example embodiment of the invention.

The buffer stage 101 may operate to isolate the input (IN) port from any impedance changes that may occur in one or more of the phase shifting stages 103$a$-$n$. It will be appreciated that the buffer stage 101 may be utilized if isolation from the phase shifting stages 103$a$-$n$ is required due to the utilization of reactive control by the phase shifting stages 103$a$-$n$, which may change the phase of a received signal as well as the input impedance and the input insertion phase of the phase shifting stages 103$a$-$n$. Accordingly, the isolation of phase by the buffer stage 101 may be needed because a phase shift from the phase shifting stages 103$a$-$n$ can disturb the phase of an input reference signal at the input (IN) port. Indeed, if an accurate phase control is desired, the deviation of the phase of the input reference signal at the input (IN) port may affect the accuracy of the control of the phase shift. Therefore, a phase-isolating buffer stage 101 may be utilized in front of or prior to the phase shifting stages 103$a$-$n$ to provide isolation between the input (IN) port and the phase shifting stages 103$a$-$n$.

In addition, because the phase shifting stages 103$a$-$n$ ultimately exhibit insertion loss that is uniform over the entire range of phase shift change, an amplifier 104 may be used prior to the phase shift stages 103$a$-$n$, following the phase shifting stages 103$a$-$n$, or between two of the phase shift stages 103$a$-$n$, to compensate for any insertion loss(es) from any phase shifting stages 103$a$-$n$, according to an example embodiment of the invention. Accordingly, one or more amplifiers 104 may boost the amplitude level which was previously reduced cumulatively (or individually) by the insertion loss of each phase shifting stage 103$a$-$n$, up to a desired level.

In FIG. 1, each section of phase shifting stages 103$a$-$n$ may be coupled with one or more respective coupling capacitors 102. In particular, each phase shifting stage 103$a$-$n$ may have a coupling capacitor 102 coupled to its input and/or output. A coupling capacitor 102 may improve insertion loss at a desired frequency range and improve the input and output matching of each phase shifting stage 103a-n by passing most of an input signal energy at a desired frequency range. A respective coupling capacitor 102 may have a series resonance with respective inductors in each phase shifting stage 103a-n while reducing the capacitance seen from the previous or the next phase shifting stage 103a-n, thereby resulting in less insertion loss at the desired frequency range, and improved phase shift for a given varactor capacitance change.

In FIG. 1, each phase shifting stage 103a-n may include a respective phase shifting network and a compensation circuit. The phase shifting network may be configured as a pi-model network, while the compensation circuit may comprise a transconductance component or transconductor. The pi-model network may be an LC network having a respective inductor 120, as well as respective varactors 122, 124 connected to the respective ends of the respective inductor 120. In addition, a compensation circuit comprising the transconductance component or transconductor 126 may be configured in parallel to one or both of the varactors 122, 124. As will be described in further detail herein, the compensation circuit can deliver or provide a negative resistance to the phase shifting network to reduce insertion loss associated with the operation of the phase shifting network, where the negative resistance based upon the transconductance is adjustable responsive to a control voltage.

It will be appreciated that many variations of FIG. 1 are available in accordance with example embodiments of the invention. For example, while FIG. 1 illustrates a single-ended configuration for an example phase shifter, it will be appreciated that an example phase shifter can likewise be implemented in a differential configuration, according to an example embodiment of the invention.

Figure 2:
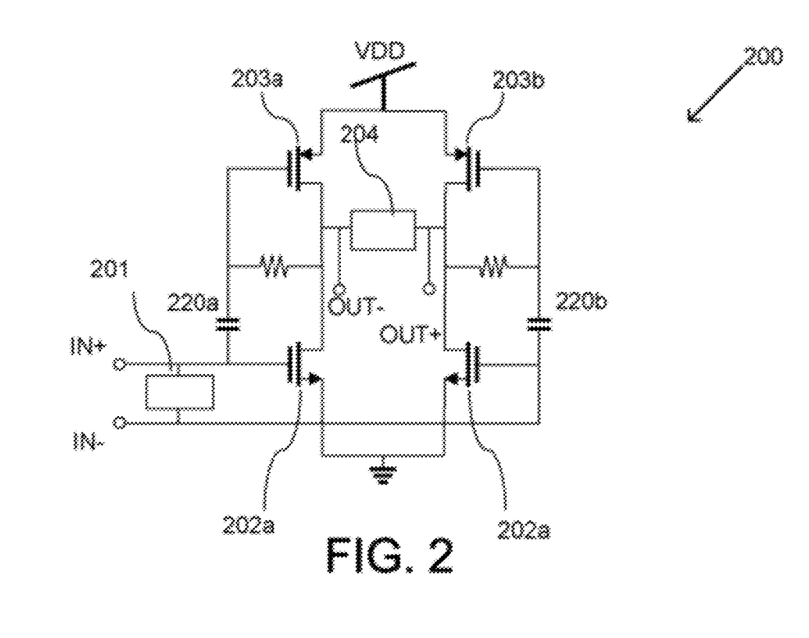
FIG. 2 is a schematic circuit of an example buffer stage used in FIG. 1, according to an example embodiment of the invention.

FIG. 2 illustrates a schematic circuit of an example buffer stage 200, according to an example embodiment of the invention. The buffer stage 200 can be an example implementation of the buffer stage 101 of FIG. 1, although variations thereof are available without departing from example embodiments of the invention.

FIG. 2 illustrates NMOS transistors 202a, 202b, as well as PMOS transistors 203a, 203b. In FIG. 2, the respective gates of NMOS transistor 202a and PMOS transistor 203a may be connected to the positive differential input port (IN+). Likewise, the respective gates of NMOS transistor 202b and PMOS transistor 203b may be connected to the negative differential input port (IN−). Input impedance 201 may represent the input impedance seen between the differential input ports (IN+, IN−). The sources of NMOS transistors 202a, 202b can be connected to ground, while the sources of PMOS transistors 203a, 203b can be connected to a DC power supply (VDD). The negative differential output port (OUT−) may be connected to the respective drain of the NMOS transistor 202a and the PMOS transistor 203a. The positive differential output port (OUT+) may be connected to the respective drain of the NMOS transistor 202b and the PMOS transistor 203b. Output impedance 204 may represent the output impedance seen between the differential output ports (OUT+, OUT−).

In FIG. 2, the input and output impedance of the example buffer stage 200 may be designed to have the necessary impedance required for the next phase shifting stage (e.g., one of phase shifting stages 103a-n connected to differential outputs OUT+ and OUT−) and for the input reference source (e.g., at differential inputs IN+ and IN−). The example buffer stage 200 may be configured to receive a high frequency input signal (e.g., differential inputs IN+ and IN−) and generate a high frequency output signal (OUT+ and OUT−), perhaps with almost 0 dB of gain but high isolation (small S12), according to an example embodiment of the invention. A feedback capacitor may be inserted at the feedback path, and any feedback signal is supposed to go through the feedback capacitor. As an example, there may be a feedback capacitor 220a in the feedback path between the negative differential output port (OUT−) and the positive differential input port (IN+). Likewise, there may be another feedback capacitor 220b in the feedback path between the positive differential output port (OUT+) and the negative differential input port (IN−). A feedback capacitor such as one of feedback capacitors 220a, 220b may operate to minimize phase deviation of an input reference signal (e.g., at IN+ or IN−) caused by the impedance variation and insertion phase variation of the next phase shifting stages by accumulating any swift change of charge at the output (e.g., at OUT+ or OUT−) of the example buffer stage 200. The value of the feedback capacitor may be selected to have enough accumulating capacity over the desired frequency range and to have a good input matching. As an example, for a desired frequency range in the gigahertz (GHz) range, the value of the feedback capacitor may be in the picofarad (pF) range, according to an example embodiment of the invention.

Figure 3:
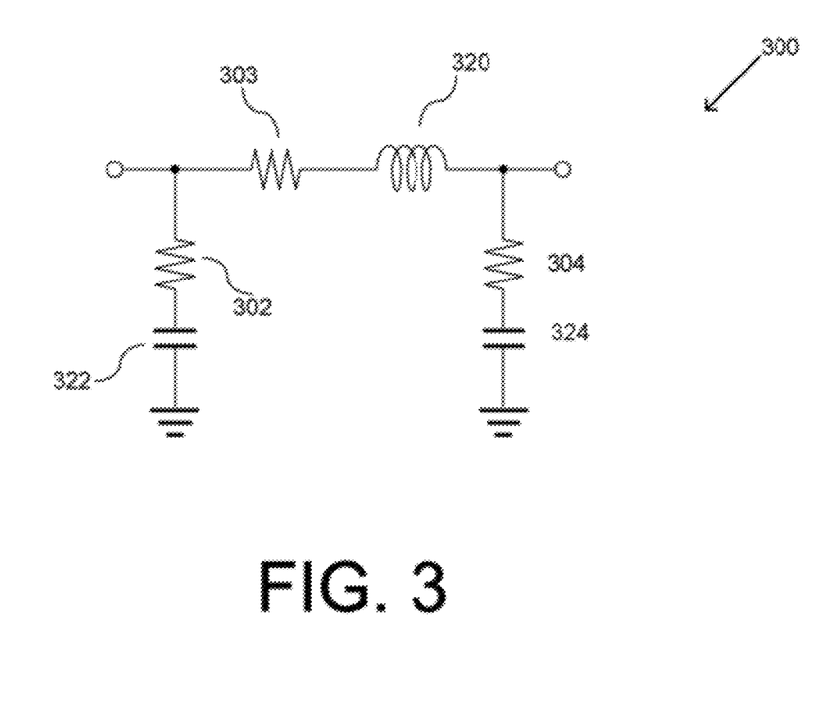
FIG. 3 is a schematic circuit of a lumped transmission line model with loss components in an inductor and varactors, according to an example embodiment of the invention.

FIG. 3 illustrates a lumped transmission line model 300 of a portion of an example phase shifting stage, according to an example embodiment of the invention. FIG. 3 may be representative of a lumped transmission line model for the phase shifting network (e.g., pi-model LC network) for any of phase shifting stages 103a-n of FIG. 1. For example, the inductor 320 of FIG. 3 may correspond to the inductor 120 of FIG. 1. Likewise, the respective capacitors or capacitances 322, 324 may correspond to the respective capacitances of respective varactors 122, 124 of FIG. 1.

In addition, FIG. 3 also shows a resistance 303 that is in series with the inductor 320, where this series resistance 303 may reflect a loss of the inductor 320. Likewise, there may be a resistance 302 in series with the capacitor 322, which may reflect a loss of the capacitor 322. Finally, there may be a resistance 304 in series with the capacitor 324, which may reflect a loss of the capacitor 324.

From the model 300 in FIG. 3, a transmission matrix or ABCD matrix can be provided as follows, where $G+jY_c$ represents the real admittance (G) and imaginary part of the admittance ($Y_c$) for either capacitor 322 or 324 (with resistance 302 or 304), and $R+jX_L$ represents the real impedance (R) and imaginary part of the impedance ($X_L$) for the inductor 320 (with resistance 303):

$$\begin{vmatrix} A & B \\ C & D \end{vmatrix} = \begin{vmatrix} 1 & 0 \\ G+jY_C & 1 \end{vmatrix} \begin{vmatrix} 1 & R+jX_L \\ 0 & 1 \end{vmatrix} \begin{vmatrix} 1 & 0 \\ G+jY_C & 1 \end{vmatrix} \quad (1)$$

The impact of an RC branch (e.g., resistance 302/capacitor 322 or resistance 304/capacitor 324) on the insertion loss (S21) or phase shift (φ21) may be less than that of an RL branch (e.g., resistance 303/inductor 320) since the overall quality factor of the model 300 may be determined mainly by the quality factor of inductors. The equation (1) may be sorted into the following equation (2) when 1/G is much less than R.

$$\begin{vmatrix} A & B \\ C & D \end{vmatrix} = \begin{vmatrix} 1 & 0 \\ G+jY_C & 1 \end{vmatrix} \begin{vmatrix} 1 & R+jX_L \\ 0 & 1 \end{vmatrix} \begin{vmatrix} 1 & 0 \\ G+jY_C & 1 \end{vmatrix} \quad (2)$$

-continued $$= \begin{vmatrix} (1 - Y_C X_L) + jRY_C & R + jX_L \\ -Y_C^2 R + j(2Y_C - Y_C^2 X_L) & (1 - Y_C X_L) + jY_C R \end{vmatrix}$$

From the above expression (2), the insertion loss (S21) and phase shift (φ21) for a given model 300 can be shown as follows in equations (3) and (4):

$$S_{21} = \frac{2}{A + B + C + D} \quad (3)$$

$$= \frac{2}{2(1 - Y_C X_L) + R - Y_C^2 R + j(2Y_C R + X_L + 2Y_C - Y_C^2 X_L)}$$

$$\phi_{21} \cong \tan^{-1}\left[\frac{Y_C^2 X_L - 2Y_C - X_L}{2(1 - Y_C X_L)}\right] \quad (4)$$

In conjunction with equation (4), the following condition should be met to satisfy minimum input (S11) and output (S22) return loss.

$$Y_C \cong -\tan\left(\frac{\phi_{21}}{2}\right), X_L = -\sin(\phi_{21}), -90 \leq \phi_{21} \leq 0 \quad (5)$$

When a capacitance is changed such that the admittance is varied from a minimum value ($Yc_{min}$) to a maximum value ($Yc_{max}$), the insertion loss (S21) and phase shift (φ21) may likewise be varied in accordance with the change. Suppose that impedance ($X_L$) is fixed as usual case with a passive inductor (e.g., inductor 320) in the IC process. The phase shift variation (delta φ21) and insertion loss variation (ΔS21) can be expressed as follows in equation (6):

$$\Delta\phi_{21} = |\phi_{21}(Y_C \text{max}) + \phi_{21}(Y_C \text{min})|, \Delta IL = S21(Y_C \text{max}) - S21(Y_C \text{min}) \quad (6)$$

Figure 4A:
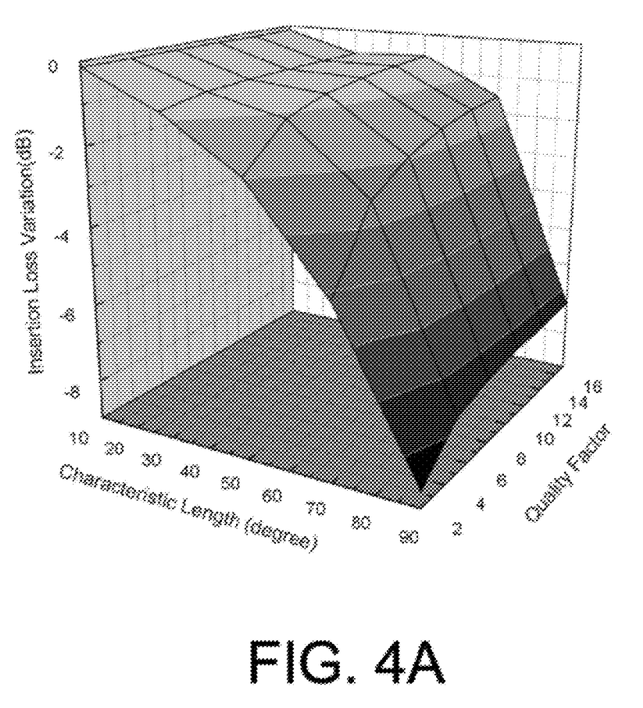
FIG. 4A illustrates the relation among insertion loss variation, characteristic length, and quality factors of the reactive components in FIG. 3, according to an example embodiment of the invention.
Figure 4B:
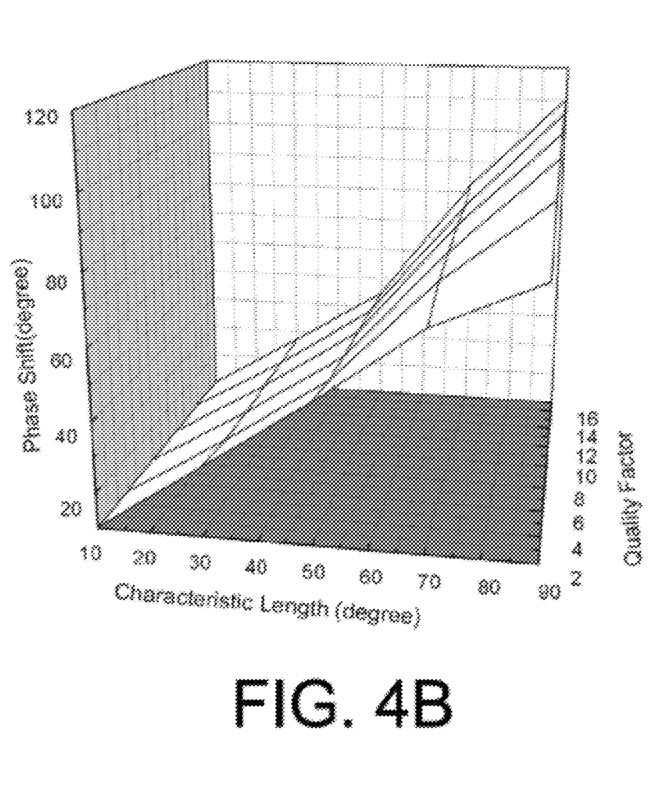
FIG. 4B illustrates the relationship among phase shift, characteristic length, and quality factors of reactive components in FIG. 3, according to an example embodiment of the invention.

FIG. 4A illustrates an example impact of a quality factor of the model 300 versus insertion loss variation for a given characteristic length derived from (Yc), when the value of $Y_c\text{max}/Y_c\text{min}$ is constant. The characteristic length may be a fixed value determined by Yc according to equation (4) since the value of the impedance ($X_L$) may be fixed. As shown in equation (5), the insertion loss (S21) and the phase (φ21) may change according to the change in admittances $Y_C$ and $X_L$. The admittance $Y_c$ can be easily replaced with any voltage controlled capacitance component such as a varactor (e.g., variable capacitor) or pn-junction. Normally, the maximum capacitance variation ratio in a CMOS process is less than 3. As shown in FIG. 4A, insertion loss variation degrades as the quality factor of the model becomes small. The degradation of the insertion loss variation (ΔS21) for the small quality factor becomes severe as a characteristic length of the model increases. Since the characteristic length of the model directly is related to the amount of the phase shift for given $Y_c\text{max}/Y_c\text{min}$, the quality factor of the model should be maximized in order to achieve low insertion loss variation (ΔS21) and large amount of phase shift for the given size, which is mainly dominated by the size of an inductor whose value is set by the characteristic length. FIG. 4B illustrates the relationship among phase shift, characteristic length and quality factors of reactive components in FIG. 3, according to an example embodiment of the invention.

It will be appreciated that the maximum phase shift for a section at a frequency may be primarily determined by the resonance frequency of the inductor and capacitors. This relationship is expressed as follows in equation (7):

$$f_r = \frac{1}{2\pi\sqrt{LC}} \quad (7)$$

When the frequency at which the phase shifter operates reaches the resonance frequency of the model, the insertion loss may degrade abruptly due to the low-pass effect, but the available amount of phase shift increases as the operating frequency is near the resonance frequency. Since the characteristic length determines the resonance frequency, a large value for the characteristic length may be beneficial in achieving large amount of phase shift for the given $Y_c\text{max}/Y_c\text{min}$, but detrimental to the insertion loss variation, and its benefit for the amount of phase shift fades away as the quality factor of the model diminishes.

Figure 5:
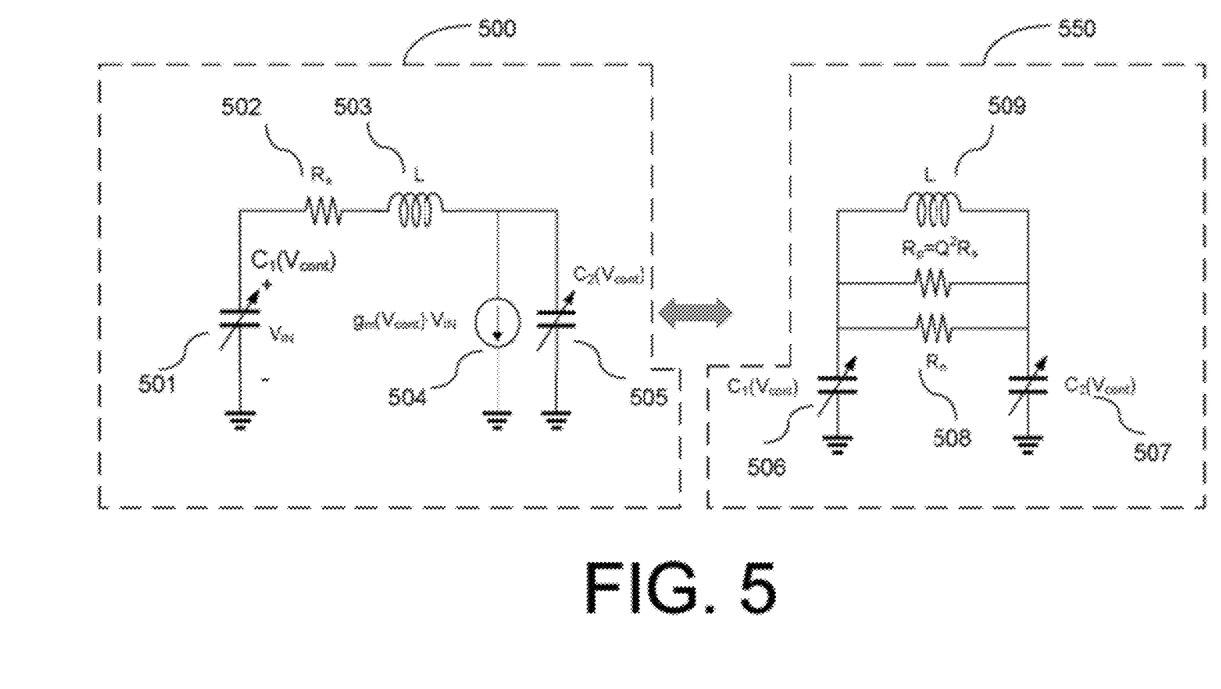
FIG. 5 illustrates how a phase shifting stage can provide loss compensation utilizing a transconductance stage, according to an example embodiment of the invention.

FIG. 5 illustrates how a phase shifting stage can provide loss compensation utilizing a transconductance stage, according to an example embodiment of the invention. More specifically, FIG. 5 illustrates a schematic of a example phase shifting stage 500 along with an equivalent schematic model 550 that illustrates loss compensation according to an example embodiment of the invention. The example phase shifting stage 500, which includes a phase shifting network and a compensation circuit, can be an example implementation for any of the example phasing shifting stages 103*a-n* of FIG. 1.

In FIG. 5, the phase shifting network of the example phase shifting stage 500 may be modeled as an LC network in a pi-model configuration. More specifically, the phase shifting network may include an inductor 503 and a series resistance 502 that represents a loss of the inductor 503, as well as two varactors 501, 505. The compensation network network, which may be parallel to varactors 501, 505, may comprise a transconductance component or transconductor 504, which may simply be referenced as a transconductance stage 504. The voltage-controlled capacitance C1(Vcont) for varactor 501 and the voltage-controlled capacitance C2(Vcont) for varactor 505 may be varied within the range which the pi-model network exhibits the necessary impedance for its input and output, thereby reducing any loss of power. As its input and output return loss is small enough not to lose much of the input signal energy ($V_{IN}$) across capacitance C1(Vcont), it does not change much for the range within which the capacitance of C1(Vcont) and C2(Vcont) changes. Since the input signal energy ($V_{IN}$) is constant, the transconductance stage 504 may generate a negative resistance which cancels loss of the pi-model network that is referenced as Rs (or Rp in model 550) in FIG. 5. As described herein, the amount of negative resistance may be based upon the transconductance that is adjusted responsive to the control voltage, as well as the capacitances of C1(Vcont) and C2(Vcont). The negative resistance (Rn) 508 in the model 550 of FIG. 5 may be expressed as follows:

$$R_n = -\frac{(C_1(V_{CONT}) + C_2(V_{CONT}))^2}{g_m(V_{CONT}) \cdot C_1(V_{CONT}) \cdot C_2(V_{CONT})} \quad (8)$$

-continued $$g_{total} = \frac{1}{R_p} - \frac{1}{R_n} \qquad (9)$$

$$= \frac{1}{Q^2 R_s} - \frac{g_m(V_{CONT}) \cdot C_1(V_{CONT}) \cdot C_2(V_{CONT})}{(C_1(V_{CONT}) + C_2(V_{CONT}))^2} > 0$$

The capacitances C1(Vcont) and C2(Vcont) represent variable capacitance as a function of a control voltage (Vcont) while gm(Vcont) represents variable transconductance as a function of the control voltage (Vcont). As shown in equation (8), the generated negative resistance by the compensation circuit does not depend on the frequency making the quality factor of the compensated pi-model unchanged over frequency. The total conductance, $g_{total}$ of the pi-model needs to be greater than zero to ensure the stability of the compensation as shown in equation (9). The condition of transconductance gm(Vcont) for the stable compensation may be derived from equation (9) and is shown in equation (10).

$$g_m(V_{CONT}) < \frac{1}{Q^2 R_s} \cdot \frac{(C_1(V_{CONT}) + C_2(V_{CONT}))^2}{C_1(V_{CONT}) \cdot C_2(V_{CONT})} = \frac{4}{Q^2 R_s} \qquad (10)$$

As long as transconductance gm(Vcont) satisfies the condition described in equation (10), the compensation may be stable. Insertion loss of the pi-model network may degrade as the quality factor of the model diminishes and the characteristic length increases due to the low pass characteristic of the model. By making the transconductance (gm) as a function of the control voltage (Vcont), the generated negative resistance (Rn) by the compensation circuit can be varied according to the control voltage (Vcont), to boost the quality factor of the model to the level at which small insertion loss is ensured even though it operates near its resonance frequency. As the transconductance gm(Vcont) decreases, and the capacitances C1(Vcont) and C2(Vcont) increase as the control voltage (Vcont) increases, small insertion loss variation and more phase shift for a given characteristic length may be achieved for a phase shifting stage, according to an example embodiment of the invention.

Figure 6:
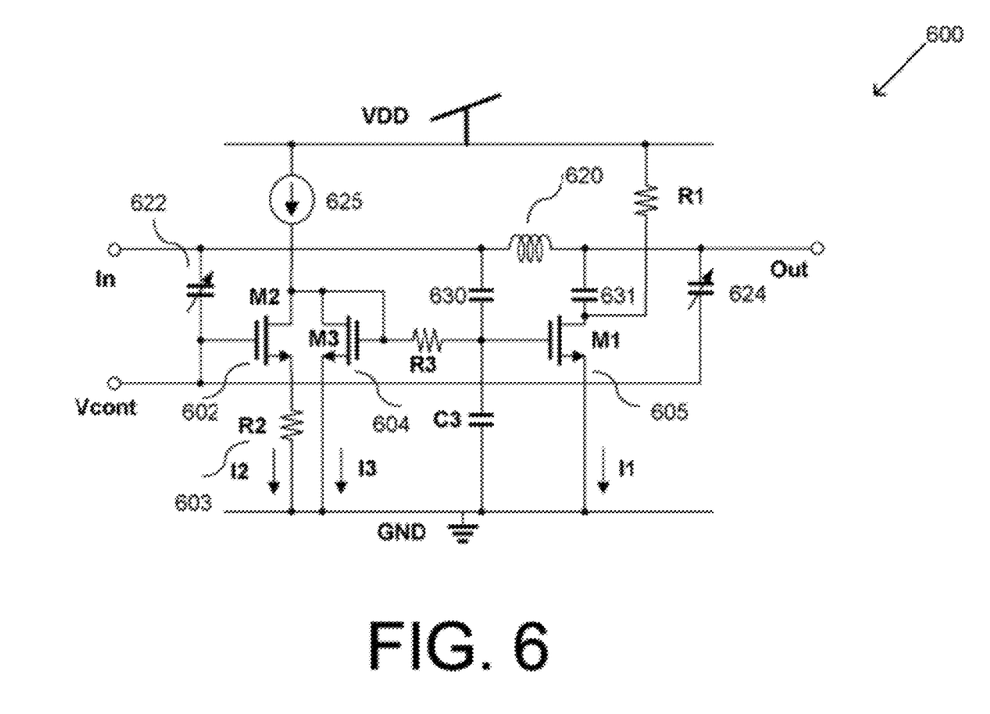
FIG. 6 illustrates an example schematic circuit of a section of an example single-ended loss compensated phase shifter or shifting stage, according to an example embodiment of the invention.

FIG. 6 illustrates an example single-ended continuous phase shifter 600 in accordance with an example embodiment of the invention. The single-ended continuous phase shifter 600 may be an example implementation for one of the phase shifting stages 103a-n of FIG. 1.

Turning now more particularly to FIG. 6, the single-ended continuous phase shifter 600 may include an input port (receiving In), an output port (providing Out), and a control port (receiving Vcont). The phase shifter may include a pi-model LC phase shifting network that comprises an inductor 620 and varactors 622, 624. The respective capacitance provided by the varactors 622, 624 may be adjusted using the control voltage signal (Vcont). In addition, the phase shifter 600 may include a compensation network that delivers a negative resistance to the phase shifting network to reduce insertion loss associated with the operation of the phase shifting network. The amount of negative resistance may be based upon the transconductance that is adjusted responsive to the control voltage. Accordingly, the compensation circuit may include a transconductance stage that includes a current source 625 and transistor M1. In addition, the compensation circuit can also include a current control circuit for adjusting an amount of current flowing through transistor M1, and accordingly, the transconductance of transistor M1. In an example embodiment of the invention, the current control circuit may comprise transistors M2, M3 configured in a differential circuit, as well as one or more degeneration resistors R2 for purposes of adjusting current flow through at least one transistor M2, M3.

In operation, the transconductance stage may sample voltage across the varactor 622 connected to the input port and generate a negative resistance that is based in part on the value of the control voltage signal (Vcont) and the transconductance of the transconductance stage. The control voltage signal (Vcont) from the control port may control the amount of phase shift and transconductance generated from the transconductance stage.

It will be appreciated that any variety of voltage-controlled capacitance components can be used for implementing any of varactors 622 or 624. For example, any of the varactors 622, 624 may be a pn-junction, an accumulation mode varactor, and/or a metal-oxide-semiconductor (MOS) varactor that is implemented in an IC process. In order to achieve a very linear phase change of the example circuit over a linear control voltage change, the capacitance to control voltage (C-V) linearity of the varactor may be ensured since primarily the C-V relationship directly translates into phase shift linearity through equation (6). One example of such a linear varactor in a CMOS process may be an accumulation mode varactor, which provides a linear capacitance change for a linear voltage change, and a relatively high quality factor compared to pn-junction and MOS varactors, according to an example embodiment of the invention.

Still referring to FIG. 6, when the control voltage (Vcont) is equal to zero, the bias current of a first transistor (M1) may be directly related to the current from other bias circuit. For simplicity, the current I1 may be assumed to be the same as the current I3 through the transconductance stage. As the control voltage (Vcont) increases, the current I2 may flow so that I3 is equal to the current difference I1-I2, and the transconductance of M1 may reduce accordingly. The rate of change in the current I2 is determined by the size of transistor M2 and degeneration transistor R2. The same control voltage (Vcont) changes capacitance of varactors 622, 624, thereby leading to the phase shift between the input and output port. A coupling capacitor may sample and add voltage at the input port and the output port. The size of the coupling capacitor may be small enough to not reduce the range of phase shift by providing a fixed capacitance, but large enough to provide small impedance at the operating frequency. In FIG. 6, there is a coupling capacitor 630 connected between the gate of transistor M1 and inductor 620, and another coupling capacitor 631 connected between the gate drain of transistor M1 and inductor. The resistor R3 and capacitor C3 may form a low pass filter so that noise going into the phase shifting stage at the operating frequency may be attenuated. The value of the load resistor R1 may be large enough not to degrade the quality factor of the model; however, the maximum value of load resistor R1 may be set by the voltage swing at the output port. A large value of load resistor R1 may incur a large voltage swing that drives transistor M1 into a triode region, which may result in a poor linearity.

Figure 7:
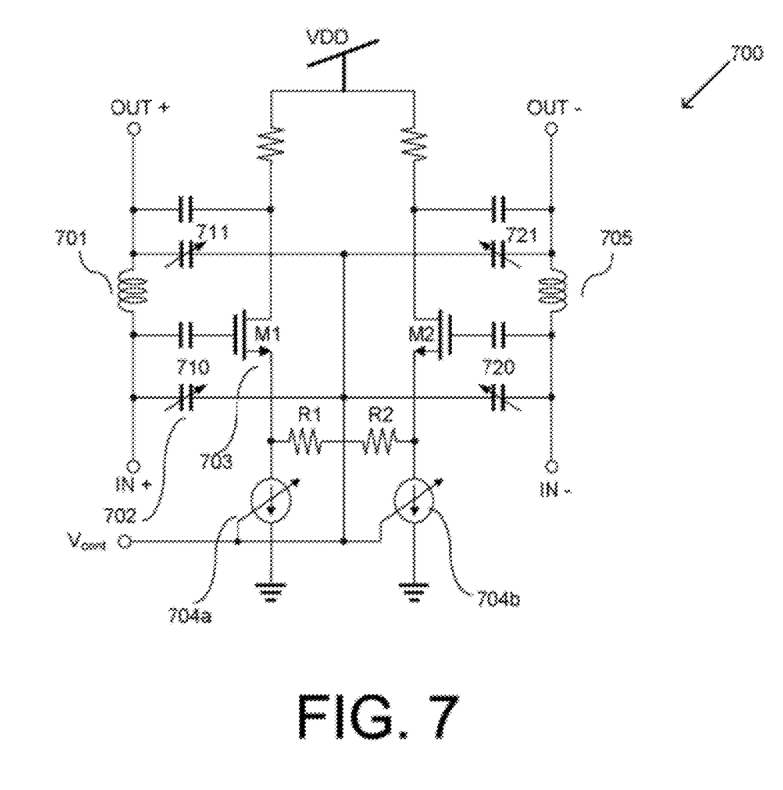
FIG. 7 illustrates an example schematic circuit of a section of an example differential loss compensated phase shifter or shifting stage, according to an example embodiment of the invention.

FIG. 7 illustrates an example embodiment of a differential continuous phase shifter 700 in accordance with an example embodiment of the invention. The differential phase shifter 700 may be utilized as an alternative to the single-ended phase shifters described herein. In FIG. 7, there is a first phase shifting network (e.g., an LC pi-model network) comprising inductor 701, and varactors 710, 711. The first phase shifting network may be configured between a first differential input port (IN+) and differential output port (OUT+). In addition, there is a first compensation circuit in communication with the first phase shifting network, where the first compensation circuit may comprise a transconductance stage having a current source 704a and transistor M1. Similarly, there is a second phase shifting network (e.g., an LC pi-model network) comprising inductor 705, and varactors 720, 721.

In FIG. 7, there is also a second compensation circuit in communication with the second phase shifting network, where the second compensation circuit may comprise a transconductance stage having a current source 704b and transistor M2. The second compensation circuit may be configured between a second differential input port (IN−) and differential output port (OUT−).

It will be appreciated that the basic operation of a differential phase shifter 700 of FIG. 7 may be similar to that described with respect to the single-ended continuous phase shifter 600 of FIG. 6. In FIG. 7, two current sources 704a, 704b at the sources of transistors M1, M2 along with two degeneration resistors R1, R2 may be utilized to improve the linearity of the transconductance stage, and the associated transconductance that affects the respective generated negative resistance.

Figure 8:
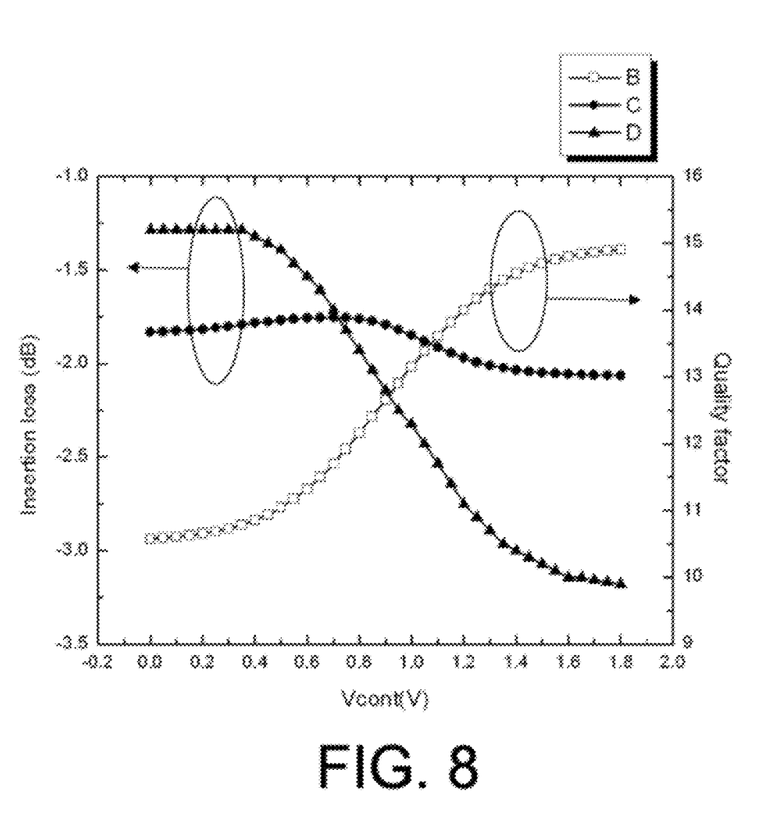
FIG. 8 illustrates a graphical relationship among boosted quality factor of the phase shifter, uncompensated insertion loss, and compensated insertion loss of the example embodiment in FIG. 1 for a 110 degree phase shift, according to an example embodiment of the invention.

FIG. 8 illustrates an example relationship among the uncompensated insertion loss, the compensated insertion loss, and the controlled overall quality factor with the control voltage (Vcont). For a given fixed $Y_c$max/$Y_c$min and a characteristic length which was chosen to maximize a phase shift, the uncompensated insertion loss shows 1.7 dB of insertion loss variation for the phase shift of 110 degrees. With the compensation which improves the quality factor of the pi-model inversely proportional to the uncompensated insertion loss, the compensated insertion loss shows only 0.2 dB of insertion loss variation. An aspect of this example compensation method may be that it can reduce the insertion loss variation for any required phase shift to an acceptable level, while without compensation, the insertion loss variation may increase proportionally as the required phase shift increases.

Many modifications and other embodiments of the invention set forth herein will come to mind to one skilled in the art to which these inventions pertain having the benefit of the teachings presented in the foregoing descriptions and the associated drawings. Therefore, it is to be understood that the inventions are not limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A system, comprising:
a phase shifting network comprising at least an inductor, a first varactor, and a second varactor configured according to a pi-network, the first and second varactors having a respective first and second variable capacitance that is controlled by a control voltage, wherein the phase shifting network operates to receive an input signal and generate an output signal, the output signal including a phase shift provided by the phase shifting network; and
a compensation circuit in communication with the phase shifting network, wherein the compensation circuit is configured in parallel with the first varactor and the second varactor and is responsive at least in part to the control voltage to adjust a transconductance of the compensation circuit, wherein the compensation circuit delivers a negative resistance to the phase shifting network to reduce insertion loss associated with operation of the phase shifting network, the negative resistance based upon the transconductance that is adjusted responsive to the control voltage.

2. The system of claim 1, wherein the first varactor or the second varactor comprises a pn-junction or an accumulation mode varactor.

3. The system of claim 1, wherein the provided phase shift changes linearly with respect to the control voltage.

4. The system of claim 1, wherein the phase shift ranges from zero to 90 degrees.

5. The system of claim 1, wherein the phase shifting network and the compensation circuit comprise a first phase shifting stage, wherein the output signal from the first phase shifting network is provided to one or more second phase shifting stages to provide additional phase shifting.

6. The system of claim 1, wherein the phase shifting network receives the input signal from an input buffer, wherein the input buffer reduces phase variation of the input signal due to any impedance mismatch.

7. The system of claim 1, further comprising an amplifier for amplifying the output signal, or another signal derived from the output signal.

8. The system of claim 1, further comprising a control circuit, wherein the control circuit controls a current through the compensation circuit, thereby adjusting the transconductance of the compensation circuit.

9. The system of claim 8, wherein the control circuit comprises a current subtracting network, the current subtracting circuit being responsive to the control voltage in controlling a magnitude of the current through the compensation circuit.

10. The system of claim 9, wherein the current subtracting network comprises a differential circuit.

11. The system of claim 1, wherein the negative resistance does not depend upon a frequency associated with the phase shifting network.

12. The system of claim 1, wherein the phase shifting network operates near a resonance frequency.

13. The system of claim 1, wherein the input signal comprises differential input signals and the output signal comprises differential output signals.

14. The system of claim 1, wherein the input signal comprises a single-ended input signal and the output signal includes a single-ended output signal.

15. The system of claim 1, wherein the insertion loss remains substantially the same as the phase shift increases.

16. A method, comprising:
providing a phase shifting network comprising at least an inductor, a first varactor, and a second varactor configured according to a pi-network, the first and second varactors having a respective first and second variable capacitance that is controlled by a control voltage;
generating, by the phase shifting network, an output signal based upon a received input signal, the output signal including a phase shift provided by the phase shifting network;
providing a compensation circuit in communication with the phase shifting network, wherein the compensation circuit is configured in parallel with the first varactor and the second varactor and is responsive at least in part to the control voltage to adjust a transconductance of the compensation circuit; and
delivering, by the compensation circuit, a negative resistance to the phase shifting network to reduce insertion loss associated with operation of the phase shifting network, the negative resistance based upon the transconductance that is adjusted responsive to the control voltage.

17. The method of claim 16, wherein the phase shifting network and the compensation circuit comprise a first phase shifting stage, wherein the output signal from the first phase shifting network is provided to one or more second phase shifting stages to provide additional phase shifting.

18. The method of claim 16, further comprising:
controlling, by a control circuit, a current through the compensation circuit, thereby adjusting the transconductance of the compensation circuit.

* * * * *